United States Patent
McKinley

(10) Patent No.: US 6,742,978 B1
(45) Date of Patent: Jun. 1, 2004

(54) WAFER INDEXING DEVICE

(75) Inventor: Steve McKinley, Mesa, AZ (US)

(73) Assignee: BTU International, Inc., North Billerica, MA (US)

( * ) Notice: Subject to any disclaimer, the term of this patent is extended or adjusted under 35 U.S.C. 154(b) by 0 days.

(21) Appl. No.: 09/732,394

(22) Filed: Dec. 7, 2000

Related U.S. Application Data

(60) Provisional application No. 60/169,435, filed on Dec. 7, 1999.

(51) Int. Cl.[7] .......................... B65B 21/02; B65B 69/00; B65G 65/04; B65G 49/07
(52) U.S. Cl. ................ 414/417.1; 414/940; 198/339.1; 198/780
(58) Field of Search .................. 414/417.1, 416.03, 414/940, 935; 198/339.1, 346.1, 465.1, 780, 788, 789

(56) References Cited

U.S. PATENT DOCUMENTS

| | | | | |
|---|---|---|---|---|
| 4,217,977 A | * | 8/1980 | Tam ...................... | 198/341.07 |
| 4,582,191 A | * | 4/1986 | Weigand ................... | 198/339.1 |
| 4,674,936 A | * | 6/1987 | Bonora ..................... | 414/217.1 |
| 4,832,474 A | * | 5/1989 | Yoshinaga et al. .......... | 359/392 |
| 5,674,039 A | * | 10/1997 | Walker et al. ......... | 414/222.05 |
| 5,713,711 A | * | 2/1998 | McKenna et al. ....... | 414/217.1 |
| 6,308,818 B1 | * | 10/2001 | Bonora et al. .............. | 198/414 |

* cited by examiner

Primary Examiner—Gene O Crawford
(74) Attorney, Agent, or Firm—Weingarten, Schurgin, Gagnebin & Lebovici LLP

(57) ABSTRACT

An indexing device including a housing, a cassette support mechanism, a cassette, and transport apparatus carried by the housing. The transport apparatus includes a bed of rollers having a common plane and a drive assembly coupled to the bed of rollers. The cassette support mechanism is mounted in the housing and movable along a pathway between a raised position and a lowered position relative the bed of rollers. The cassette is mounted on the cassette support mechanism.

16 Claims, 2 Drawing Sheets

WAFER INDEXING DEVICE

This application claims the benefit of U.S. Provisional Application No. 60/169,435, filed Dec. 7, 1999.

FIELD OF THE INVENTION

This invention relates to automated devices in the semiconductor industry.

More particularly, the present invention relates to indexing devices.

In a further and more specific aspect, the instant invention concerns indexing devices for use in the semiconductor industry.

BACKGROUND OF THE INVENTION

The use of indexing devices is well known in the semiconductor industry. These devices are employed to automatically load semiconductor wafers into various processing apparatus, such as plasma etch devices, curing devices, etc., during semiconductor fabrication. The very nature of semiconductor processing requires an extremely sterile environment. Besides slowing production and increasing man hours, manual handling of wafers greatly increases contamination thereby reducing quality and yield.

Conventional indexing devices employ what are essentially rubber bands to transport wafers. While effective, the bands require continuous adjustment and are not particularly accurate in their placement of the wafer in a cassette or in a processing device.

It would be highly advantageous, therefore, to remedy the foregoing and other deficiencies inherent in the prior art.

Accordingly, it is an object of the present invention to provide a new and improved indexing device.

Another object of the invention is to provide an indexing device that will evenly and uniformly transport disks.

And another object of the invention is to provide an indexing device which will accurately place wafers.

Still another object of the present invention is to provide an indexing device which is reliable.

SUMMARY OF THE INVENTION

Briefly, to achieve the desired objects of the instant invention in accordance with a preferred embodiment thereof, provided is an indexing device for loading disks into and unloading disks from a cassette. The indexing device includes a housing having a cassette support mechanism for receiving a cassette, and transport apparatus carried by the housing. The transport apparatus includes a bed of rollers having a common plane and a drive assembly coupled to the bed of rollers.

In a specific aspect, the cassette support mechanism is movable along a pathway between a raised position and a lowered position relative the bed of rollers. The cassette support mechanism is positioned above the bed of rollers in the raised position and is positioned below the bed of rollers in the lowered position. In a more specific aspect, the bed of rollers extends at least partially into the pathway, and the cassette is supported so that disks contained therein are substantially parallel to the plane of the bed of rollers.

In yet a more specific aspect, the bed of rollers includes a plurality of axles rotatably coupling the rollers to the housing and the drive assembly includes a motor coupled to the housing, a drive wheel coupled to the motor, a plurality of driven wheels coupled to the axles of the bed of rollers, and a drive belt coupling the drive wheel to the plurality of driven wheels.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENT

Figure 1:
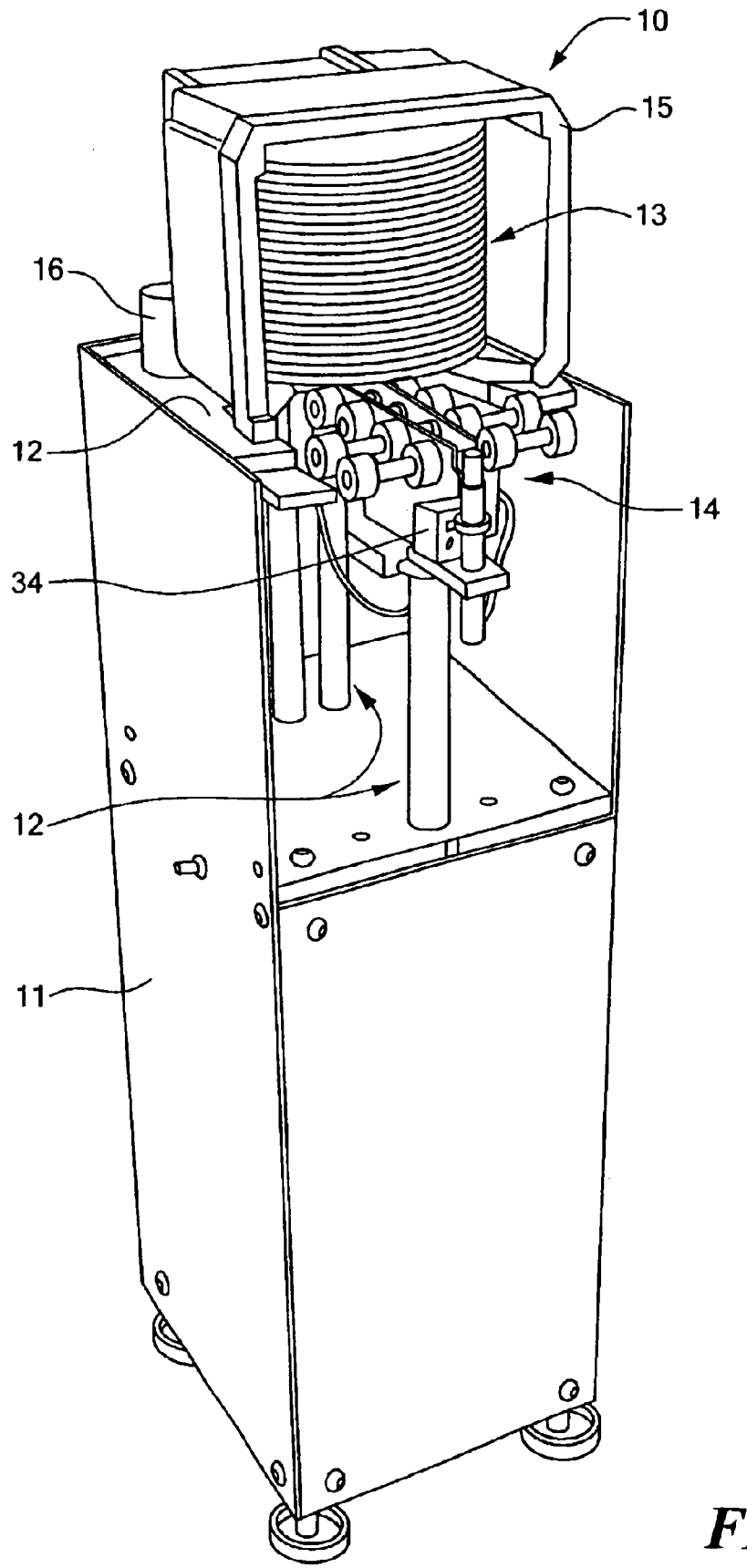
FIG. 1 is an isometric view of an indexing device comprising a housing supporting a cassette containing disks and apparatus for distributing the disks from the cassette.

Turning to the drawings, in which like reference characters indicate corresponding elements throughout the several views, FIG. 1 is an isometric view of an indexing device or indexer 10 comprising a housing 11 a cassette supporting mechanism 12 and transport apparatus 14. A cassette 15 is mounted to cassette supporting mechanism 12 and contains disks 13. Apparatus 14 distributes disks 13 to or from cassette 15. Disks 13 can be semiconductor substrates such as silicon wafers, gallium arsenide wafers, etc., or other items such as memory disks. In this embodiment, cassette 15 carries disks 13 atop indexing device 10. Disks 13 are held by slots within cassette 15 in a stacked condition, and are individually fed onto apparatus 14 which sequentially delivers them to or from, for instance, another device. Because cassette 15 carries disks 13 atop apparatus 14, disks 13 can be gravity fed to apparatus 14. In alternate embodiments, cassette 15 may be located below apparatus 14 or at any other location for facilitating gravity or passive feed to apparatus 14 or a mechanized or active feed to apparatus 14. Cassette 15 is open or openable, which allows disks 13 to be easily installed into cassette 15 in a stacked condition as needed.

In this preferred embodiment, cassette 15 is mounted on cassette support mechanism 12 which raises and lowers cassette 15 relative apparatus 14. Cassette support mechanism 12 is movable along a pathway between a raised position above apparatus 14 and a lowered position below apparatus 14. Cassette support mechanism 12 can be raised and lowered in any conventional manner, but is preferably raised by a motor 16, in this embodiment, guided by housing 11. Disks 13 are loaded beginning at the top of cassette 15, and as disks 13 are loaded into cassette 15, cassette 15 is raised relative apparatus 14. Thus disks 13 are sequentially inserted into slots in cassette 15 from the top to the bottom. Unloading disks 13 is in reverse, with the unloading beginning at the bottom of cassette 15 and progressing to the top as cassette 15 is lowered by cassette support mechanism 12.

Apparatus 14 is comprised of a bed of rollers 20. Rollers 20 reside along a common plane that, in this embodiment, is substantially parallel to each of disks 13. Cassette 15 may be designed to carry disks 13 in a fashion not necessarily substantially parallel to rollers 20 if desired. Rollers 20 are fixed to axles 21. Axles 21 are supported by a base 22 for rotation, and base 22 is carried by housing 11. In an alternate embodiment, axles 21 may be supported directly by housing 11 for rotation. Axles 21 are driven for rotation by a drive assembly 30 that is preferably carried by base 22. In an alternate embodiment, drive assembly 30 may be supported directly by housing 11.

Figure 2:
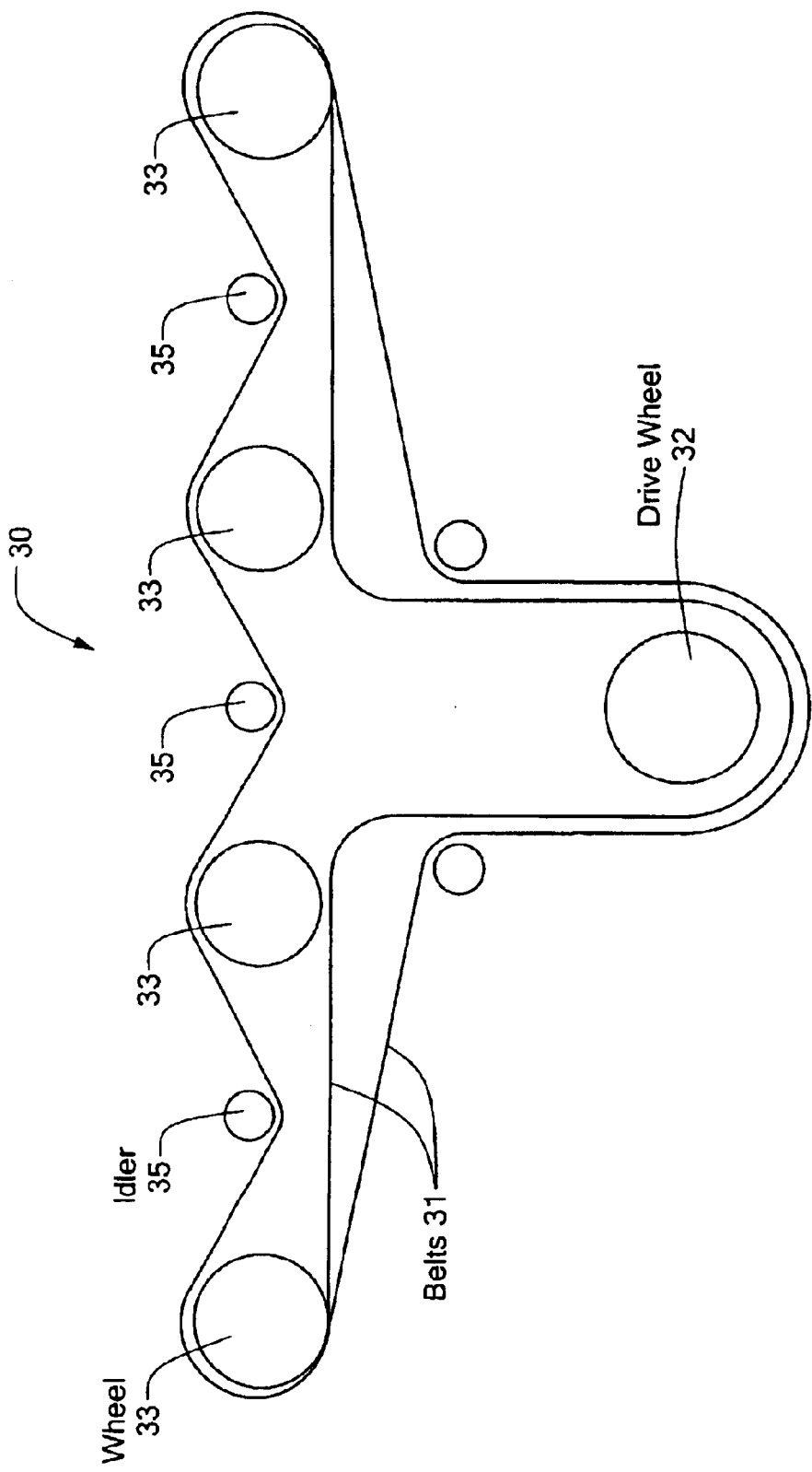
FIG. 2 is a side elevational view of a drive assembly of the apparatus of FIG. 1.

Turning to FIG. 2, drive assembly 30 is comprised of belts 31 carried by a drive wheel 32 and driven wheels 33.

Although two belts are shown, less or more may be used. A motor 34 (FIG. 1) is coupled to drive wheel 32 and drives drive wheel 32 for rotation. Motor 34 may comprise any conventional motor powered by electricity or any suitable form of consumable fuel. Drive wheel 32 may be manually driven if desired. Belts 31 are each endless, flexible and preferably constructed of rubber, a rubber-like material or other stretchable or at least somewhat stretchable material. A non-stretchable material may be used if desired. In any event, belts 31 are supported in a stretched or tensioned condition about drive wheel 32 and driven wheels 33. Idler wheels 35 are positioned to ensure belts 31 run against drive wheel 32 and each one of driven wheels 33. As drive wheel 32 rotates, belts 31 will track and drive driven wheels 33 for rotation. Driven wheels 33 are fixed to axles 21. As a result, when driven wheels 33 rotate, axles 21 and rollers 20 are also driven for rotation.

In operation, apparatus 14 may be configured to operate continuously or at regular or irregular intervals for providing a continuous feed of disks 13, or a feed of disks 13 at regular or irregular intervals. Sensors can be provided which activate motor 34 when a disk is present and deactivate when the disk is inserted into the cassette. Disks 13 are each sequentially presented directly upon only rollers 20. As rollers 20 are driven for rotation by drive assembly 30, each one of disks 13 that is presented upon or against rollers 20 is fed or driven outwardly from cassette 15 and housing 11 and to, for instance, another device or instrument associated with indexing device 10. Depending on the direction a user wishes to feed disks 13, drive assembly 30 can be configured to drive rollers 20 for rotation in a clockwise direction or a counterclockwise direction.

The present invention has been described above with reference to a preferred embodiment. However, those skilled in the art will recognize that changes and modifications may be made in the described embodiments without departing from the nature and scope of the present invention. Various changes and modifications to the embodiment herein chosen for purposes of illustration will readily occur to those skilled in the art. For example belts 31 may be in the form of chains, with driven wheels 33 in the form of sprockets. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. An indexing device for loading disks into and unloading disks from a cassette, the indexing device comprising:
   a housing including a cassette support mechanism moveable along a pathway between a raised position and a lowered position, for receiving a cassette; and
   transport apparatus carried by the housing, the transport apparatus including a bed of rollers having a common plane and a drive assembly coupled to the bed of rollers, the bed of rollers extending into the pathway of the cassette support mechanism, for receiving disks from a cassette directly thereon.

2. An indexing device as claimed in claim 1 wherein the cassette support mechanism is positioned above the bed of rollers in the raised position and is positioned below the bed of rollers in the lowered position.

3. An indexing device as claimed in claim 2 wherein the cassette support mechanism supports a cassette so that disks contained therein are substantially parallel to the plane of the bed of rollers.

4. An indexing device as claimed in claim 3 wherein the bed of rollers includes a plurality of axles rotatably coupling the rollers to the housing.

5. An indexing device as claimed in claim 4 wherein the drive assembly includes:
   a motor coupled to the housing;
   a drive wheel coupled to the motor;
   a plurality of driven wheels coupled to the axles of the bed of rollers; and
   a drive belt coupling the drive wheel to the plurality of driven wheels.

6. An indexing device as claimed in claim 5 wherein the drive assembly further includes a plurality of idler wheels maintaining frictional engagement between the drive belt and the driven wheels.

7. An indexing device comprising:
   a housing;
   transport apparatus carried by the housing, the transport apparatus including a bed of rollers having a common plane and a drive assembly coupled to the bed of rollers;
   a cassette support mechanism mounted in the housing and movable along a pathway between a raised position and a lowered position relative the bed of rollers;
   a cassette mounted on the cassette support mechanism and movable by the cassette support mechanism between the raised position and the lowered position; and
   wherein the bed of rollers extends at least partially into the pathway of the cassette support mechanism.

8. An indexing device as claimed in claim 7 wherein the cassette support mechanism is positioned above the bed of rollers in the raised position and is positioned below the bed of rollers in the lowered position.

9. An indexing device as claimed in claim 8 wherein the cassette support mechanism supports the cassette so that disks contained therein are substantially parallel to the plane of the bed of rollers.

10. An indexing device as claimed in claim 9 wherein the bed of rollers includes a plurality of axles rotatably coupling the rollers to the housing.

11. An indexing device as claimed in claim 10 wherein the drive assembly includes:
   a motor coupled to the housing;
   a drive wheel coupled to the motor;
   a plurality of driven wheels coupled to the axles of the bed of rollers; and
   a drive belt coupling the drive wheel to the plurality of driven wheels.

12. An indexing device as claimed in claim 11 wherein the drive assembly further includes a plurality of idler wheels maintaining frictional engagement between the drive belt and the driven wheels.

13. An indexing device comprising:
   a housing;
   transport apparatus carried by the housing, the transport apparatus including a bed of rollers having a common plane and a drive assembly coupled to the bed of rollers;
   a cassette support mechanism mounted in the housing and movable along a pathway between a raised position, above the bed of rollers, and a lowered position, below the bed of rollers, the cassette support mechanism positioned so the bed of rollers extends at least partially into the pathway; and a cassette, containing a plurality of disks, mounted on the cassette, support mechanism and movable by the cassette support mechanism between the raised position and the lowered position, the disks being substantially parallel to the plane of the bed of rollers and receivable directly thereon.

14. An indexing device as claimed in claim 13 wherein the bed of rollers includes a plurality of axles rotatably coupling the rollers to the housing.

15. An indexing device as claimed in claim 14 wherein the drive assembly includes:

a motor coupled to the housing;

a drive wheel coupled to the motor;

a plurality of driven wheels coupled to the axles of the bed of rollers; and a drive belt coupling the drive wheel to the plurality of driven wheels.

16. An indexing device as claimed in claim 15 wherein the drive assembly further includes a plurality of idler wheels maintaining frictional engagement between the drive belt and the driven wheels.

* * * * *